(12) United States Patent
Lin (10) Patent No.: US 11,482,475 B2
(45) Date of Patent: Oct. 25, 2022

(54) GROUND WING PORTION FOR ELECTRONIC PACKAGE DEVICE

(71) Applicant: ALi Corporation, Hsinchu (TW)

(72) Inventor: Chin-Sung Lin, Taipei (TW)

(73) Assignee: ALi Corporation, Hsinchu (TW)

( * ) Notice: Subject to any disclaimer, the term of this patent is extended or adjusted under 35 U.S.C. 154(b) by 24 days.

(21) Appl. No.: 17/306,955

(22) Filed: May 4, 2021

(65) Prior Publication Data

US 2022/0037239 A1 Feb. 3, 2022

(30) Foreign Application Priority Data

Jul. 31, 2020 (CN) .......................... 202010764568.6

(51) Int. Cl.
| | |
|---|---|
| *H01L 23/495* | (2006.01) |
| *H01L 23/48* | (2006.01) |
| *H01L 21/00* | (2006.01) |
| *H05K 7/10* | (2006.01) |
| *H05K 9/00* | (2006.01) |
| *H05K 7/18* | (2006.01) |
| *H01L 23/498* | (2006.01) |
| *H01L 21/56* | (2006.01) |

(Continued)

(52) U.S. Cl.
CPC ........ *H01L 23/49551* (2013.01); *H01L 21/56* (2013.01); *H01L 23/3107* (2013.01); *H01L 23/4952* (2013.01); *H01L 23/49503* (2013.01); *H01L 23/49555* (2013.01); *H01L 23/49838* (2013.01); *H01L 24/48* (2013.01); *H01L 2224/48245* (2013.01); *H01L 2224/48257* (2013.01); *H01L 2924/182* (2013.01)

(58) Field of Classification Search
CPC ......... H01L 2924/181; H01L 23/49838; H01L 23/49551; H01L 23/49503; H01L 23/49555; H01L 23/3107; H01L 23/4952; H01L 21/56; H01L 24/49
See application file for complete search history.

(56) References Cited

U.S. PATENT DOCUMENTS

| | | | |
|---|---|---|---|
| 7,989,933 B1 * | 8/2011 | Kim ................. | H01L 23/49541 |
| | | | 257/676 |
| 8,008,758 B1 * | 8/2011 | Kim .................... | H01L 23/3128 |
| | | | 257/E23.047 |

(Continued)

FOREIGN PATENT DOCUMENTS

CN 102332441 B 5/2014

*Primary Examiner* — Alonzo Chambliss
(74) *Attorney, Agent, or Firm* — Li & Cai Intellectual Property Office (57) ABSTRACT

An electronic package device and a carrier structure thereof are provided. The carrier structure includes a die attach paddle, a ground frame, a pin assembly, and a ground wing portion. The ground frame surrounds the die attach paddle. The pin assembly includes a plurality of pins that are spaced apart from one another. The pins extend radially outward and are arranged to surround the ground frame. The ground wing portion is connected to the ground frame and located in a space under the pin assembly. The ground wing portion includes an extending part and a joint part, the extending part extends away from the die attach paddle, and a top end of the extending part is located at a position above where a bottom surface of the die attach paddle is located.

19 Claims, 11 Drawing Sheets

(51) Int. Cl.
*H01L 23/31* (2006.01)
*H01L 23/00* (2006.01)

(56) References Cited

U.S. PATENT DOCUMENTS

| | | | |
|---|---|---|---|
| 9,337,240 B1 | 5/2016 | Lee et al. | |
| 2008/0142938 A1* | 6/2008 | Chow | H01L 23/49503 257/676 |
| 2010/0207260 A1* | 8/2010 | Chen | H01L 23/49541 257/670 |
| 2015/0206834 A1* | 7/2015 | Tiu | H01L 23/49558 438/123 |
| 2015/0270195 A1* | 9/2015 | Wong | H01L 24/49 257/676 |

* cited by examiner

GROUND WING PORTION FOR ELECTRONIC PACKAGE DEVICE

CROSS-REFERENCE TO RELATED PATENT APPLICATION

This application claims the benefit of priority to China Patent Application No. 202010764568.6, filed on Jul. 31, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic package device and a carrier structure thereof, and more particularly to an electronic package device for transmitting high frequency signals and a carrier structure thereof.

BACKGROUND OF THE DISCLOSURE

In conventional package technologies, a die having a plurality of solder pads is usually disposed on a die paddle of a lead frame having a plurality of signal pins and a plurality of power pins, and then the solder pads of the die are respectively and electrically connected to the signal and power pins of the lead frame by performing a wire bonding process. Afterwards, a molding compound is used such that the die, a plurality of bonding wires, and the lead frame are packaged together to form an electronic package structure, such as a quad flat package (QFP) structure.

When the electronic package structure mounted on a printed circuit board cooperates with the printed circuit board, a current path is formed by the bonding wires for transmitting signals or supplying power, the signal and power pins, and a ground pad, so as to define a loop area. The loop area defined by the current path is in positive correlation with a parasitic inductance. That is to say, the larger the loop area defined by the current path is, the larger the parasitic inductance becomes. However, when the parasitic inductance becomes too large, signal impedance mismatch, power noise, and a decrease of power integrity may occur. Therefore, how the parasitic inductance and the power noise can be reduced whilst improving the power integrity is still one of the issues to be solved in the relevant industry.

SUMMARY OF THE DISCLOSURE

In response to the above-referenced technical inadequacies, the present disclosure provides an electronic package device and a carrier structure thereof, so as to improve power integrity during operation of the electronic package device.

In one aspect, a carrier structure is provided in the present disclosure, and the carrier structure includes a die attach paddle, a ground frame, a pin assembly, and a ground wing portion. The ground frame surrounds the die attach paddle. The pin assembly includes a plurality of pins that are spaced apart from one another. The pins extend radially outward and are arranged to surround the ground frame. The ground wing portion is connected to the ground frame and located in a space under the pin assembly. The ground wing portion includes an extending part and a joint part, the extending part extends away from the die attach paddle, and a top end of the extending part is located at a position above where a bottom surface of the die attach paddle is located.

In certain embodiments, a portion of the plurality of pins is disposed above and across the ground wing portion, and another portion of the plurality of pins does not overlap with the ground wing portion in a vertical direction.

In certain embodiments, each of the pins includes a main portion and a bent portion connected to the main portion. A shortest vertical distance between the main portion of one of the pins disposed above and across the ground wing portion and the extending part of the ground wing portion is less than a pitch between two adjacent ones of the pins.

In certain embodiments, the bent portion of one of the pins disposed above and across the ground wing portion and the extending part of the ground wing portion have a largest horizontal distance therebetween, and the largest horizontal distance is less than a pitch between two adjacent ones of the pins.

In certain embodiments, the carrier structure further includes another ground wing portion. The ground wing portion and the another ground wing portion are respectively located at two different sides of the ground frame. In another embodiment, the ground wing portion and the another ground wing portion are located at a same side of the ground frame and spaced apart from each other.

In certain embodiments, the ground wing portion extends outwardly from the ground frame and completely surrounds the ground frame.

In certain embodiments, the ground frame includes a frame body, at least one first connection element, and at least one second connection element. The at least one first connection element extends downward from the frame body to the die attach paddle, and the at least one second connection element extends upward from the frame body to the ground wing portion.

In certain embodiments, a largest height difference between the extending part and the bottom surface of the die attach paddle is greater than a shortest vertical distance between the extending part and one of the pins.

In another aspect, the present disclosure provides an electronic package device that includes a carrier structure, a chip, a plurality of first conductive wires, a plurality of second conductive wires, and a mold layer. The carrier structure includes a die attach paddle, a ground frame, a pin assembly, and a ground wing portion. The ground frame surrounds the die attach paddle. The pin assembly includes a plurality of pins that are spaced apart from one another. The pins extend radially outward and are arranged to surround the ground frame. The ground wing portion is connected to the ground frame and located in a space under the pin assembly. The ground wing portion includes an extending part and a joint part, the extending part extends away from the die attach paddle, and a top end of the extending part is located at a position above where a bottom surface of the die attach paddle is located. The chip is disposed on the die attach paddle of the carrier structure. The first conductive wires are connected to the chip and the ground frame, and the second conductive wires are connected to the chip and are respectively connected to the pins. The mold layer covers the chip, the first conductive wires, and the second conductive wires, in which the mold layer partially covers the carrier structure, and the joint part of the ground wing portion is not covered and exposed from the mold layer.

In certain embodiments, each of the pins includes a main portion and a bent portion connected to the main portion, and the mold layer covers the main portion of each of the pins and does not cover the bent portion.

In certain embodiments, the bottom surface of the die attach paddle is exposed at one of the surfaces of the mold layer.

Therefore, in the electronic package device and the carrier structure thereof provided by the present disclosure, by virtue of "the ground wing portion being connected to the ground frame and located under the pin assembly, in which the ground wing portion includes the extending part and the joint part," and "a top end of the extending part is located at a position above where a bottom surface of the die attach paddle is located," a loop area defined by a current path can be decreased, thereby improving the power integrity.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
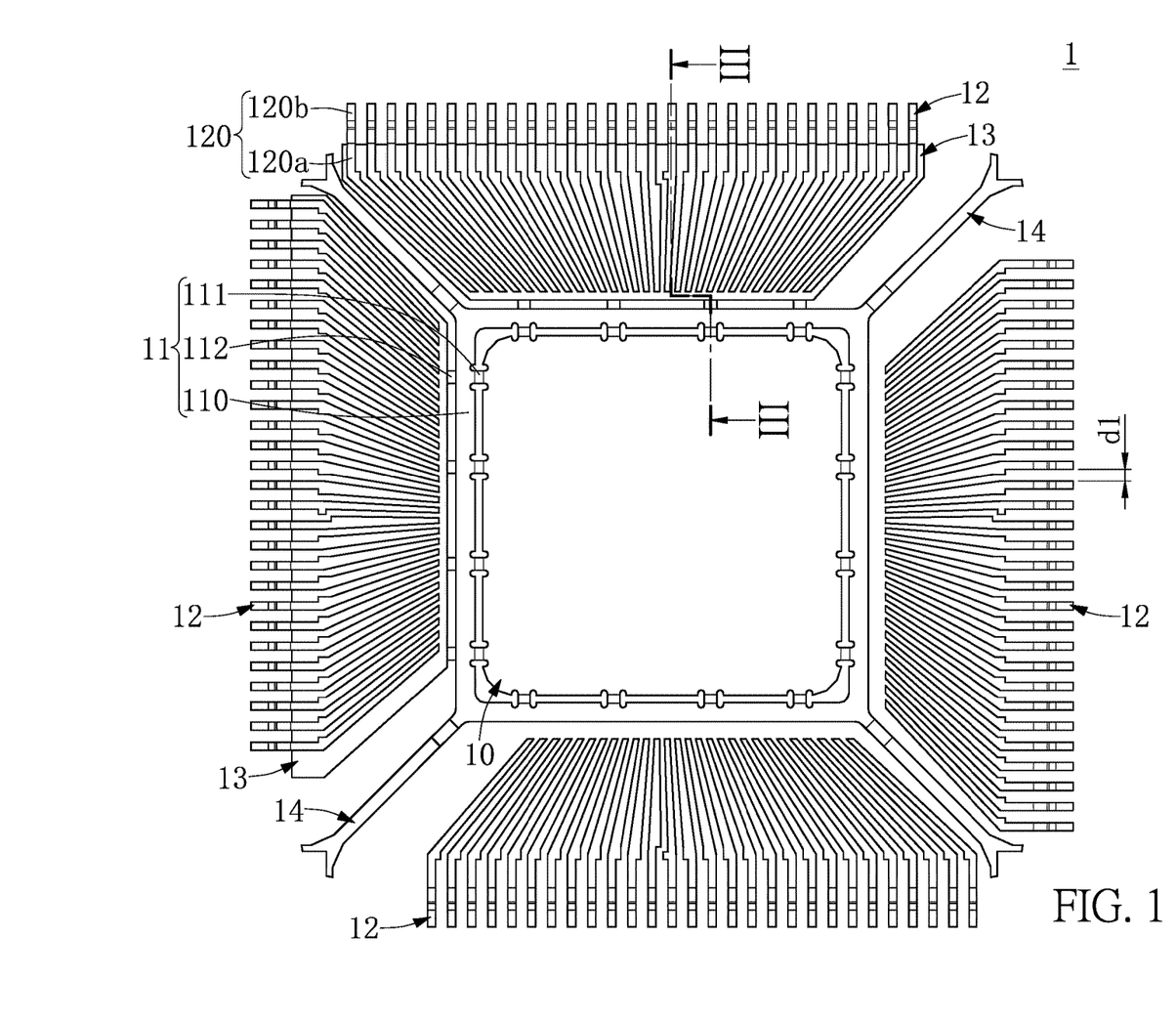
FIG. 1 is a schematic top view of a carrier structure according to a first embodiment of the present disclosure.
Figure 2:
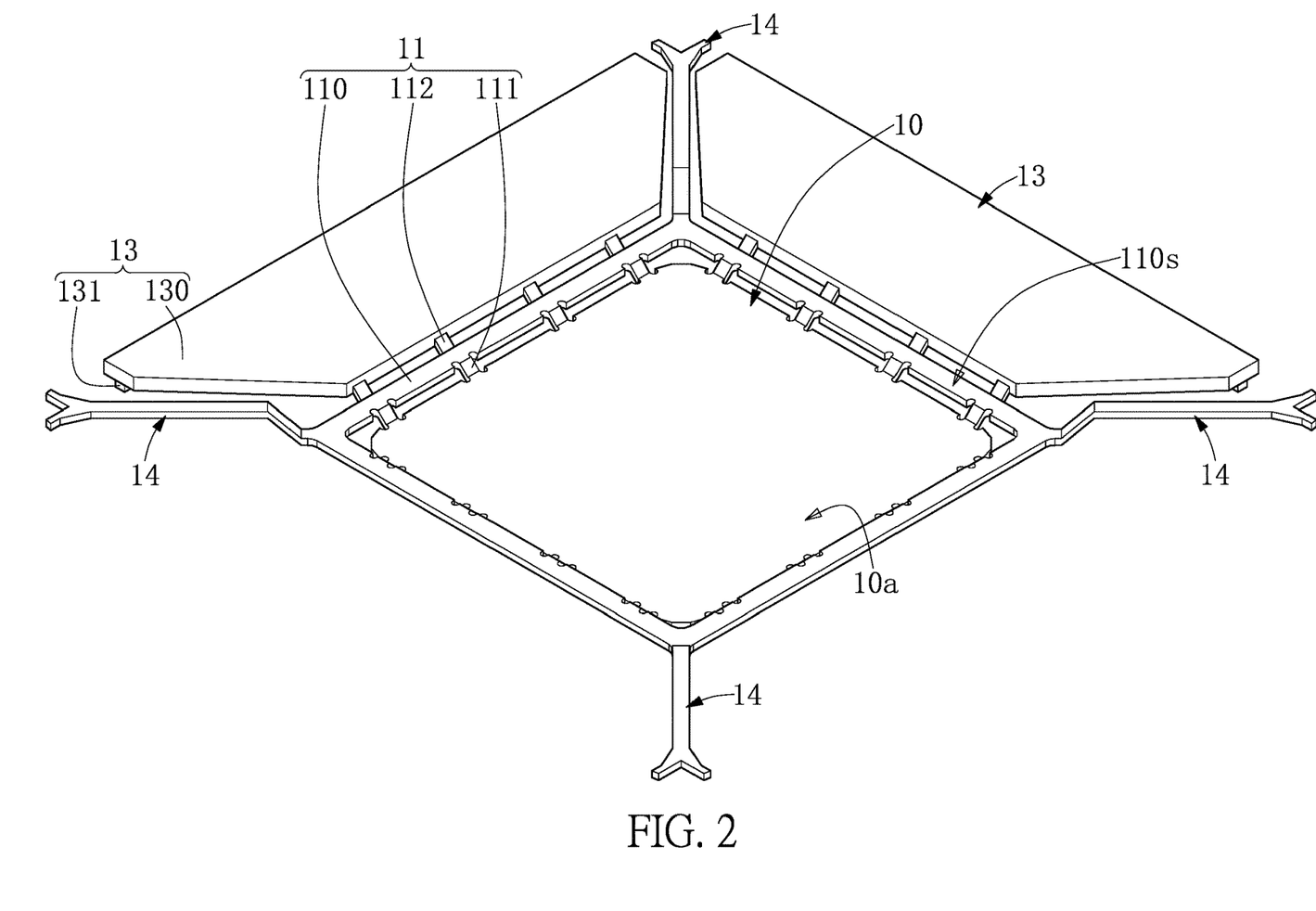
FIG. 2 shows a schematic perspective view of the carrier structure shown in FIG. 1 but without a pin assembly illustrated therein.

Reference is made to FIG. 1 and FIG. 2. FIG. 1 is a schematic top view of a carrier structure according to a first embodiment of the present disclosure, and FIG. 2 shows a perspective schematic view of the carrier structure shown in FIG. 1, in which the pin assembly is omitted. The carrier structure 1 can be used to support a chip, so that the chip can be electrically connected to an external circuit. Accordingly, during operation of the chip, the carrier structure 1 is also used to transmit high-frequency signals.

As shown in FIG. 1, the carrier structure 1 of the embodiment provided in the present disclosure includes a die attach paddle 10, a ground frame 11, a pin assembly 12, and at least one ground wing portion 13.

In the instant embodiment, the die attach paddle 10 is used to support the chip and has a supporting surface 10a and a bottom surface 10b opposite to the supporting surface 10a. The ground frame 11 surrounds and is connected to the die attach paddle 10. As shown in FIG. 1 and FIG. 2, the ground frame 11 includes a frame body 110, at least one first connection element 111 (a plurality of the first connection elements 111 are exemplarily illustrated in FIG. 2), and at least one second connection element 112 (a plurality of the second connection elements 112 are exemplarily illustrated in FIG. 2).

The frame body 110 is substantially in a loop shape and has a wire-bonding surface 110s. The die attach paddle 10 is located at a central region that is defined by the frame body 110. However, as shown in FIG. 2, in the instant embodiment, there is a height difference between the die attach paddle 10 and the frame body 110. That is to say, the wire bonding surface 110s is located at a position higher than a position of the supporting surface 10a of the die attach paddle 10.

Furthermore, as shown in FIG. 2, each of the first connection elements 111 is connected to an inner edge of the frame body 110, and each of the second connection elements 112 is connected to an outer edge of the frame body 110.

Each of the first connection elements 111 is connected between the die attach paddle 10 and the frame body 110. Since there is a height difference between the die attach paddle 10 and the ground frame 11, each of the first connection elements 111 extends downward from the inner edge of the frame body 110 to an edge of the die attach paddle 10. Each of the second connection elements 112 is connected between the frame body 110 and the ground wing portion 13, i.e., each of the second connection elements 112 extends upward from the outer edge of the frame body 110 to the ground wing portion 13.

Referring to FIG. 1 again, the carrier structure 1 further includes a plurality of connecting strips 14, and the connecting strips 14 extend outwardly and respectively from four corners of the ground frame 11, but the present disclosure is not limited thereto.

As shown in FIG. 1, the pin assembly 12 includes a plurality of pins 120 that are spaced apart from one another, and the pins 120 extend radially outward. It should be noted that the pins 120 are arranged to surround the ground frame 11, but are not physically connected to the ground frame 11. Furthermore, the pins 120 can be arranged at different sides of the die attach paddle 10 (or the ground frame 11) so as to transmit power signals or other signals, respectively. For example, depending on particular implementations, the pins 120 can each be designated as a clock signal pin, an address signal pin, a command signal pin, a data signal pin, an I0 power pin, a core power pin, etc.

Figure 3:
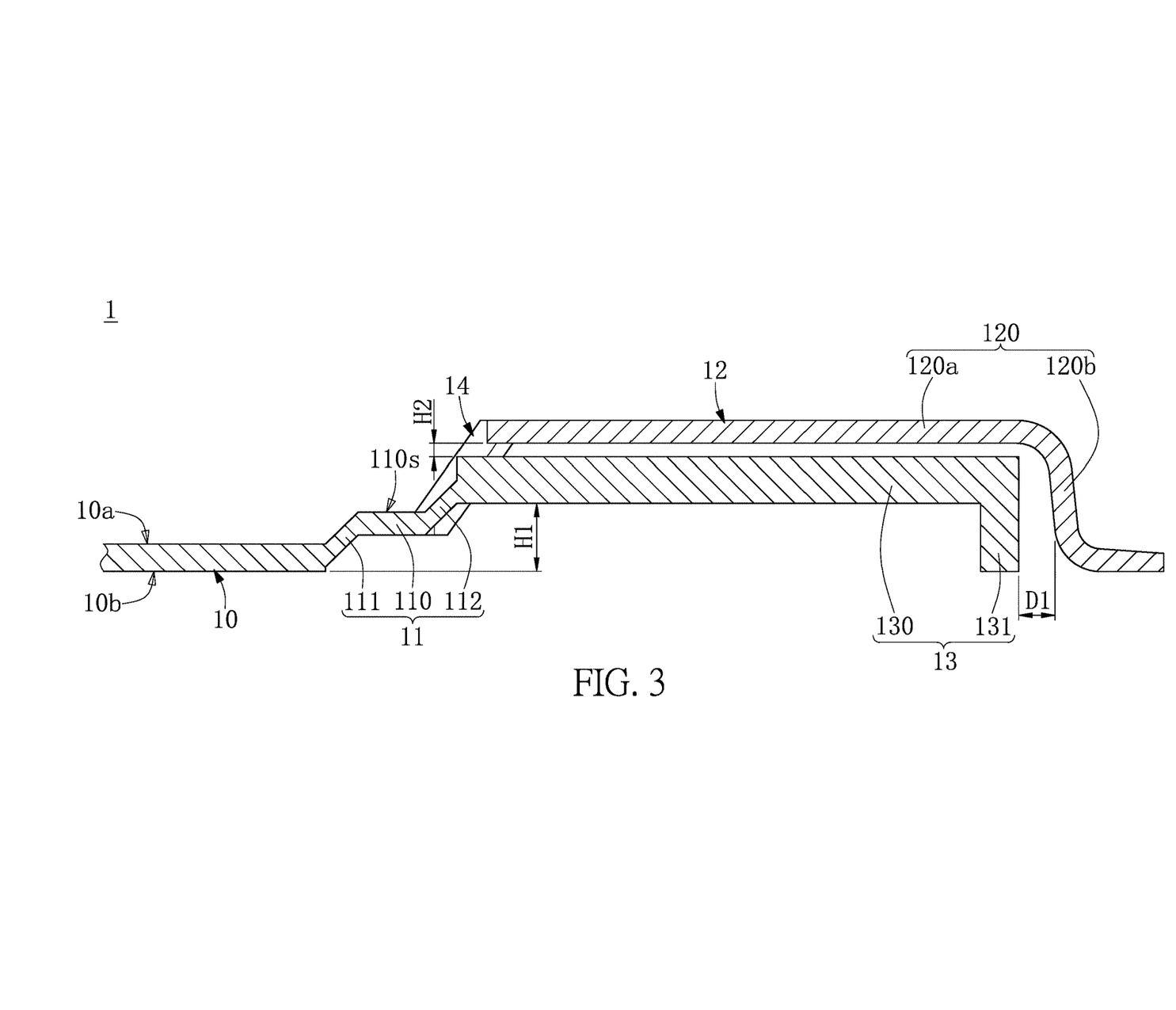
FIG. 3 is a partial cross-sectional view taken along line III-III of FIG. 1.

Reference is made to FIG. 3, which is a cross-sectional view taken along line III-III of FIG. 1. Specifically, each of the pins 120 includes a main portion 120a and a bent portion 120b that is connected to the main portion 120a. As shown in FIG. 3, the main portion 120a of each of the pins 120 is located at a position higher than where the frame body 110 of the ground frame 11 is located. Furthermore, the bent portion 120b of each of the pins 120 extends downward from an end of the main portion 120a so as to be connected to an external circuit (such as a circuit board). In the instant embodiment, the bottom end of the bent portion 120b of each of the pins 100 is substantially level with the bottom surface 10b of the die attach paddle 10. Moreover, as shown in FIG. 1, a pitch d1 is defined between the bent portions 120b of two adjacent ones of the pins 120, which is about 100 μm.

Reference is made to FIG. 1 to FIG. 3. The ground wing portion 13 is connected to the ground frame 11 and located in a space under the pin assembly 12. That is to say, the ground wing portion 13 is arranged under the pins 120 so as to shield the pins 120. As shown in FIG. 2 and FIG. 3, the ground wing portion 13 includes an extending part 130 and a joint part 131. The extending part 130 extends away from the die attach paddle 10, and there is a height difference between the extending part 130 and the die attach paddle 10.

Specifically, the top end of the extending part 130 is located at a position higher than where the bottom surface 10b of the die attach paddle 10 is located. In one preferred embodiment, a largest height difference H1 between the extending part 130 and the bottom surface 10b of the die attach paddle 10 is greater than a shortest vertical distance H2 between the extending part 130 and one of the pins 120. Additionally, a bottom end of the extending part 130 and the bottom surface 10b of the die attach paddle 10 are located at the same height level. In the instant embodiment, the extending part 130 extends away from the die attach paddle 10 along a horizontal direction, but the present disclosure is not limited thereto.

In another embodiment, the extending part 130 can include a stepped structure, an inclined portion or a combination thereof. As long as the top end of the extending part 130 is located at a position higher than where the bottom surface 10b of the die attach paddle 10 is located, the structure of the extending part 130 is not limited in the present disclosure. As such, a loop area defined by a current path can by decreased by an arrangement of the ground wing portion 13, thereby decreasing a parasitic inductance. Effects produced by the ground wing portion 13 will be explained in detail in the following descriptions.

Furthermore, the ground wing portion 13 is connected to the second connection elements 112 of the ground frame 11. As shown in FIG. 3, the extending part 130 of the ground wing portion 13 is connected to the frame body 110 through the second connection elements 112. In the instant embodiment, each of the second connection elements 112 extends upward from the outer edge of the frame body 110 to the extending part 130 of the ground wing portion 13, but the present disclosure is not limited thereto.

In another embodiment, when the extending part 130 is located at a position that is higher than the position of the die attach paddle 10 but is lower than or level with the position of the frame body 110, the second connection elements 112 can extend horizontally or downwardly from the outer edge of the frame body 110 to the extending part 130 of the ground wing portion 13. However, as long as the ground wing portion 13 can be connected to the ground frame 11, the shapes of the second connection elements 112 are not limited in the present disclosure.

As shown in FIG. 3, at least one of the pins 120 is disposed over the ground wing portion 13, and overlaps with the ground wing portion 13 in a vertical direction. Reference is made to FIG. 1 and FIG. 3. In the instant embodiment, for one of the pins 120 that is disposed over the ground wing portion 13, a shortest vertical distance H2 between the main portion 120a and the extending part 130 of the ground wing portion 13 is less than the pitch d1 between two adjacent ones of the pins 120. For example, when the pitch d1 between two adjacent ones of the pins 120 is 100 μm, the shortest vertical distance H2 between the main portion 120a and the ground wing portion 13 is less than 100 μm, and is preferably less than 80 μm.

It should be noted that in the conventional electronic package structure, since pitches between a plurality of signal or power pins arranged side by side are too small, and no ground plane is near the pins to provide shielding, crosstalk induced among the pins (including the signal pins and power pins) is severe, which negatively impacts the transmission quality. If a plurality of ground pins is additionally arranged in order to reduce the crosstalk among the signal or power pins, not only will a total number of the pins be increased, but an overall size of the electronic package structure will also be increased.

However, in the embodiment of the present disclosure, since the ground wing portion 13 is arranged to be closer to one of the pins 120, when the pins 120 are used to transmit signals or power, the signal or power transmitted by any two adjacent ones of the pins 120 do not easily interfere with each other. That is to say, the ground wing portion 13 can be used to shield the pins 120. Compared to the conventional electronic package structure, in the carrier structure 1 of the embodiment of the present disclosure, the crosstalk among the pins 120 can be attenuated by the ground wing portion 13, thereby improving transmission quality.

Furthermore, as shown in FIG. 3, a largest horizontal distance D1 between the joint part 131 and the bent portion 120b of the pin 120 that is disposed over the ground wing portion 13 is also less than the pitch d1 between two adjacent ones of the pins 120. As such, the ground wing portion 13 can shield the pins 120 more completely, so as to further reduce the crosstalk between the signals. It should be noted that in the present disclosure, it is not necessary for the largest horizontal distance D1 between the joint part 131 and the bent portion 120b of the pin 120 that is disposed over the ground wing portion 13 to be less than the pitch d1 between two adjacent ones of the pins 120. That is to say, in the present disclosure, as long as at least one of the aforementioned shortest vertical distance H2 and the largest horizontal distance D1 is less than the pitch d1 between two adjacent ones of the pins 120, the signal transmission quality can be improved.

It should be noted that the ground wing portion 13 can be selectively disposed under a portion of the pins 120, e.g., only under the pins 120 that have a greater requirement for being shielded. For example, the ground wing portion 13 can be disposed under only those of the pins 120 that are used to transmit signals at a high speed, and the ground wing portion 13 need not shield all of the pins 120.

Reference is made to FIG. 1 and FIG. 2. In the instant embodiment, the carrier structure 1 includes two ground wing portions 13, and the two ground wing portions 13 are respectively located at different sides of the ground frame 11. Accordingly, a portion of the plurality of the pins 120 is disposed over the ground wing portions 13, and another portion of the plurality of the pins 120 does not overlap with the ground wing portions 13 in a vertical direction.

Figure 4:
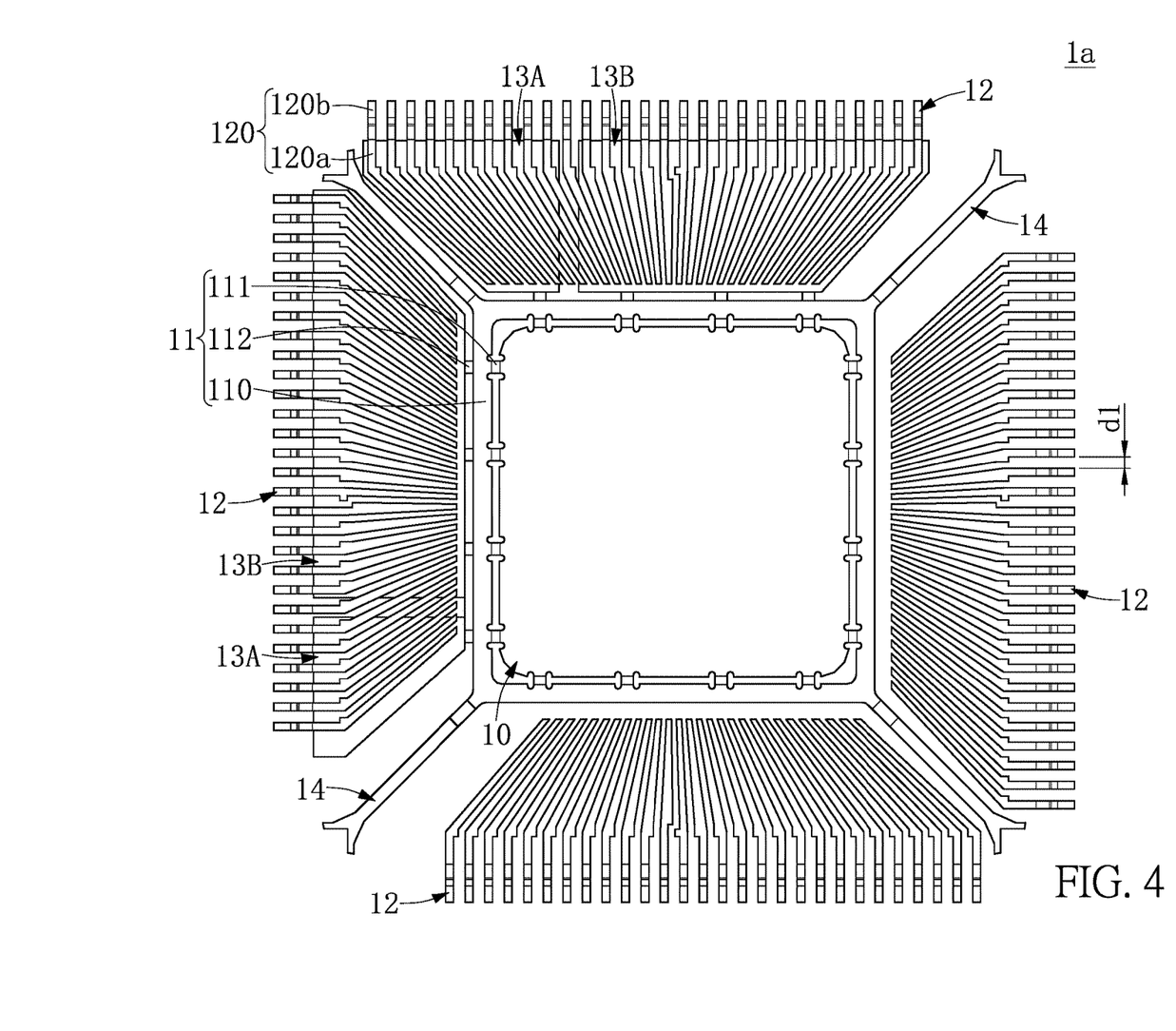
FIG. 4 is a schematic top view of the carrier structure according to a second embodiment of the present disclosure.

Furthermore, a quantity of the portion of the pins 120 that corresponds to and is shielded by the ground wing portion 13 is not limited. Reference is made to FIG. 4, which is a schematic top view of a carrier structure according to a second embodiment of the present disclosure. In the embodiment shown in FIG. 4, the two ground wing portions 13A, 13B of the carrier structure 1a are arranged at the same side of the ground frame 11, and are spaced apart from each other. In addition, the two ground wing portions 13A, 13B can be of different sizes so as to shield different quantities of the pins 120.

Figure 5:
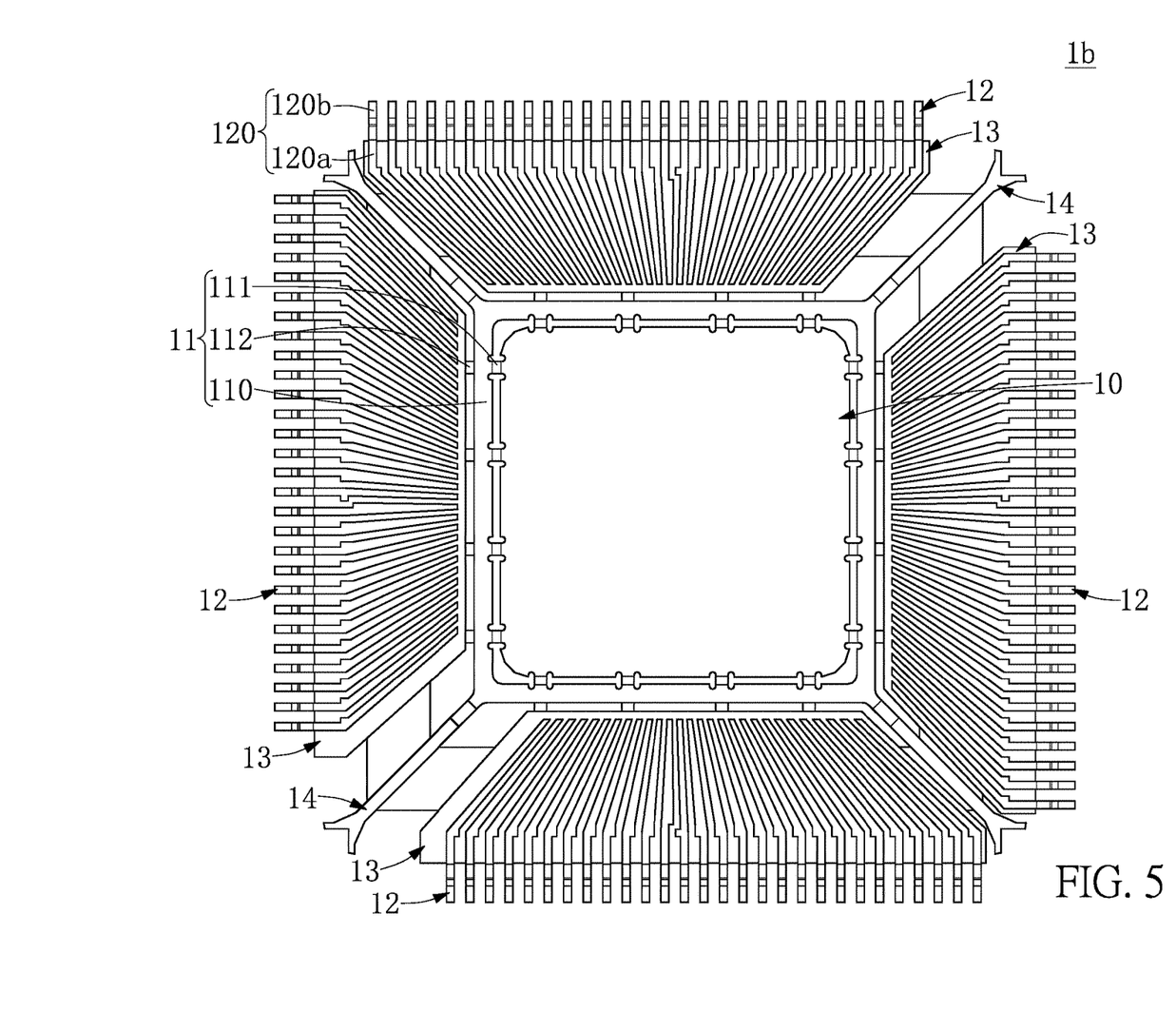
FIG. 5 is a schematic top view of the carrier structure according to a third embodiment of the present disclosure.

However, the present disclosure is not limited to the aforementioned embodiments. Reference is made to FIG. 5, which is a schematic top view of a carrier structure according to a third embodiment of the present disclosure. In the embodiment shown in FIG. 5, all of the pins 120 need to be shielded, and the carrier structure 1b can include four ground wing portions 13 that are respectively connected to four sides of the ground frame 11. In another embodiment, the ground wing portions 13 and the four connecting strips 14 can be formed in one piece. That is to say, the ground wing portions 13 can extend outwardly with the ground frame 11 as a center, and completely surround the ground frame 11. As such, the ground wing portions 13 can shield all of the pins 120 of the pin assembly 12, thereby further reducing the signal crosstalk and improving the signal transmission quality.

Figure 6:
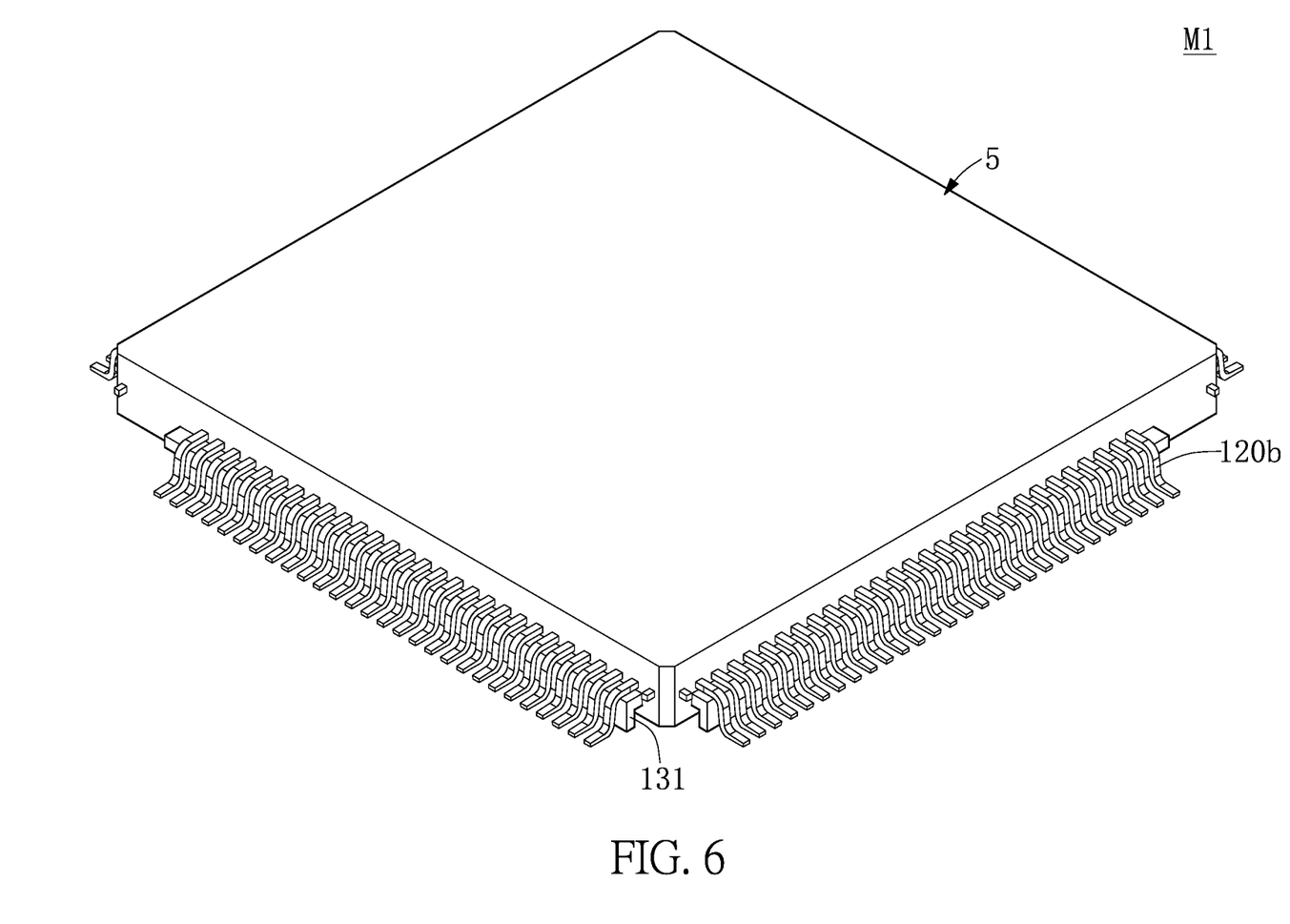
FIG. 6 shows a schematic perspective view of an electronic package device according to one embodiment of the present disclosure.
Figure 7:
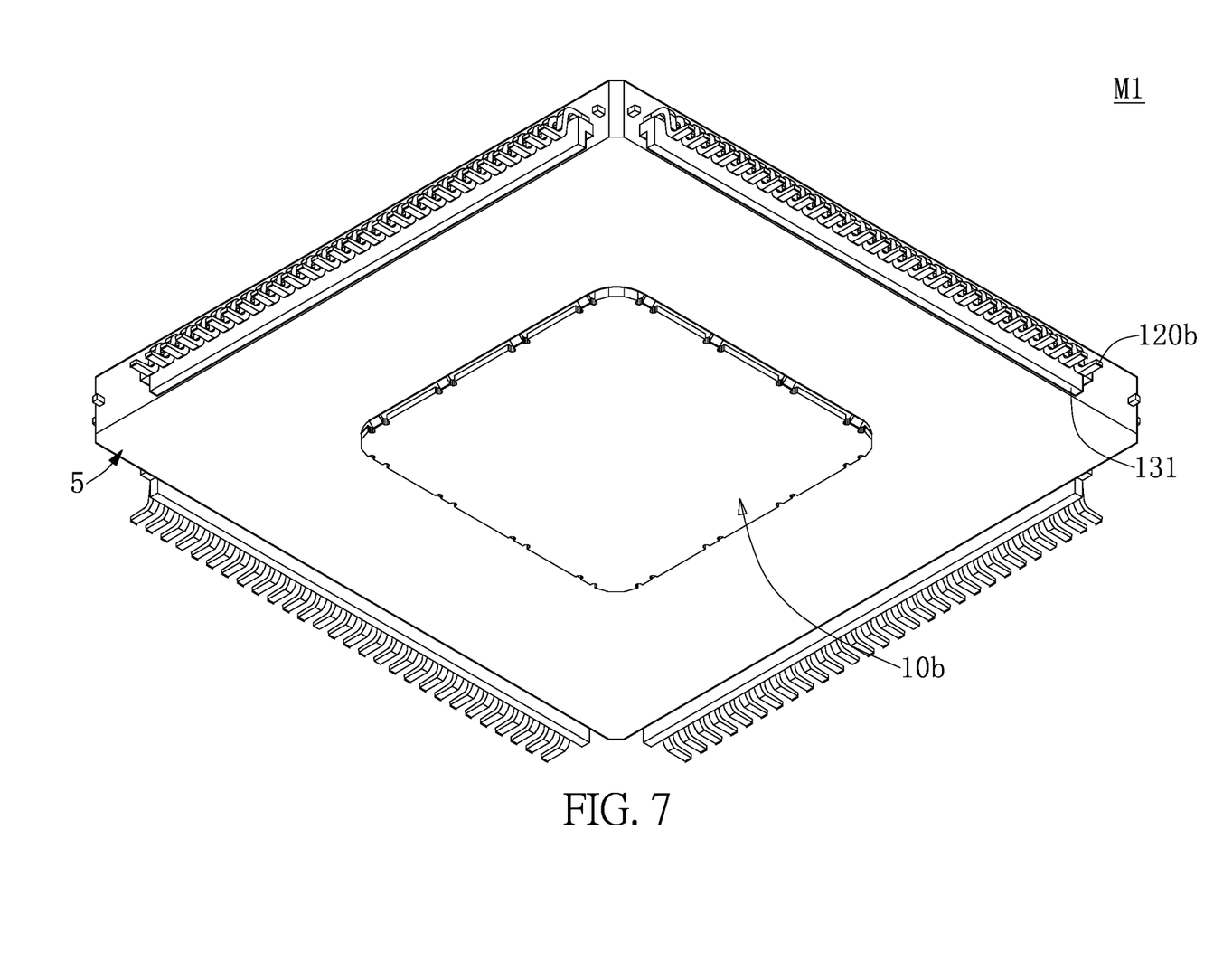
FIG. 7 shows another perspective schematic view of the electronic package device shown in FIG. 6.
Figure 8:
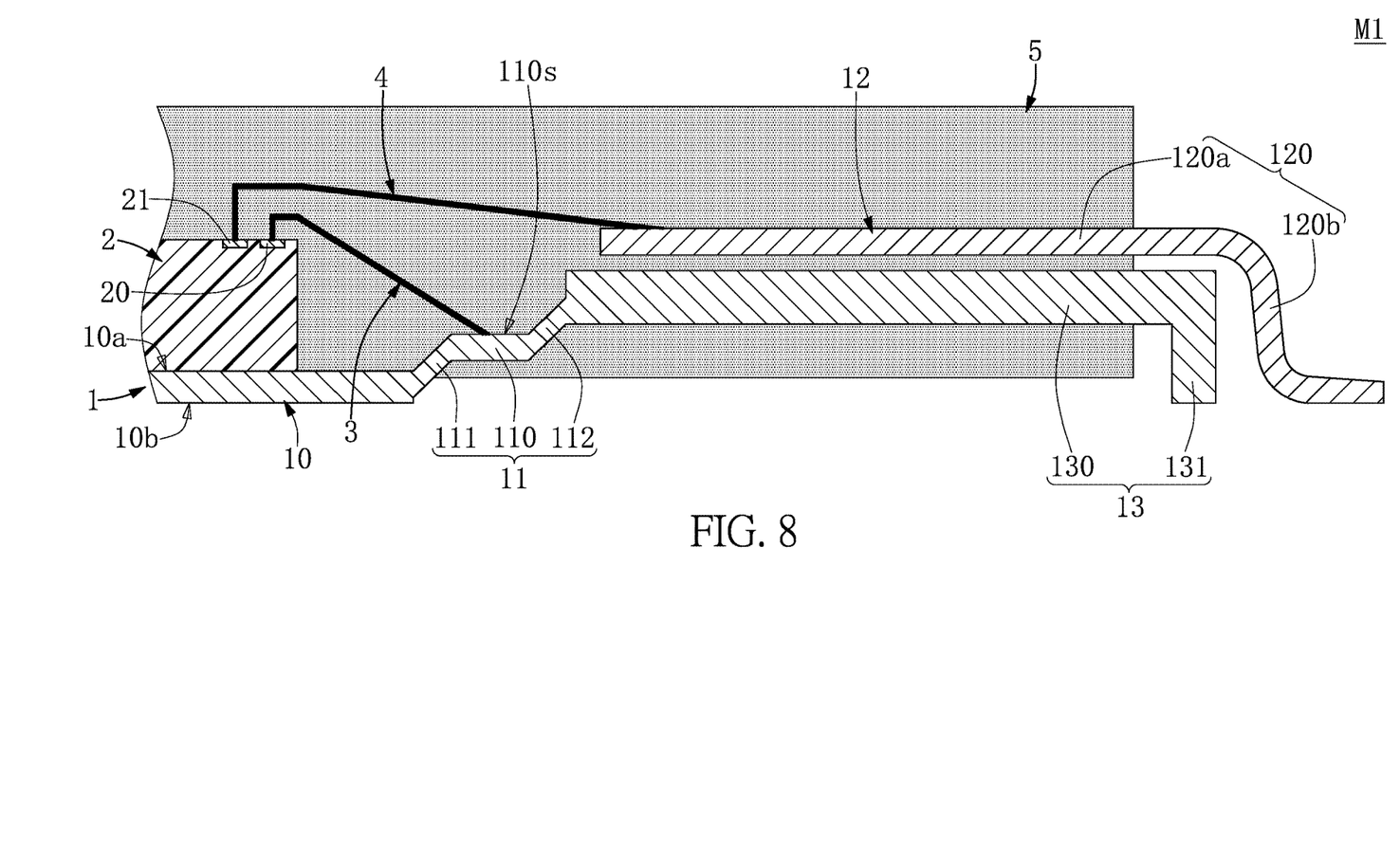
FIG. 8 is a partial cross-sectional view of the electronic package device shown in FIG. 6.

Reference is made to FIG. 6 to FIG. 8. FIG. 6 shows a perspective schematic view of an electronic package device according to an embodiment of the present disclosure, FIG. 7 shows another perspective schematic view of the electronic package device shown in FIG. 6, and FIG. 8 is a partial cross-sectional schematic view of the electronic package device shown in FIG. 6.

In the embodiment of the present disclosure, an electronic package device M1 includes a carrier structure 1, a chip 2, a plurality of first conductive wires 3, a plurality of second conductive wires 4, and a mold layer 5. It should be noted that the carrier structure 1 can be replaced with any one of the carrier structures 1a, 1b of the second and third embodiments. In the instant embodiment, the carrier structure 1 illustrated in FIG. 1 is exemplified for description, and the details of the carrier structure 1 will not be reiterated herein.

Reference is made to FIG. 8. The chip 2 can be, for example, a system on chip (SoC). Furthermore, the chip 2 of the embodiment in the present disclosure can be used to transmit signals at a high speed, such as at a speed higher than 1800 MHz. The chip 2 usually includes a plurality of contact pads, and the pads can include a plurality of signal/power contact pads 21 and a plurality of ground contact pads 20. The chip 2 is disposed on the die attach paddle 10, and each of the contact pads 20, 21 of the chip 2 can be electrically connected to a corresponding one of the pins 120 through the first conductive wires 3 and the second conductive wires 4.

Referring to FIG. 8, the plurality of first conductive wires 3 is connected between the chip 2 and the ground frame 11. To be more specific, each of the ground contact pads 20 can be electrically connected to the ground frame 11 through a corresponding one of the first conductive wires 3. Each of the first conductive wires 3 is connected to the wire-bonding surface 110s of the ground frame 11. Furthermore, the second conductive wires 4 are connected to the chip 2 and are respectively connected to the pins 120. As shown in FIG. 8, the signal/power contact pads 21 of the chip 2 are respectively connected to the corresponding pins 120 through the corresponding second conductive wires 4.

Reference is made to FIG. 6 to FIG. 8. The mold layer 5 covers the chip 2, the first conductive wires 3 and the second conductive wires 4, and partially covers the carrier structure 1. Specifically, the mold layer 5 covers the main portion 120a of each of the pins 120, but does not cover the bent portion 120b thereof. Furthermore, the extending part 130 of the ground wing portion 13 is covered by the mold layer 5, while the joint part 131 of the ground wing portion 130 is exposed from the mold layer 5. As a whole, the joint part 131 of the ground wing portion 13 and the bent portion 120b of each of the pins 120 are not covered by the mold layer 5, and are exposed outside the mold layer 5. Furthermore, as shown in FIG. 7, the bottom surface 10b of the die attach paddle 10 can be exposed at a surface (bottom face) of the mold layer 5. Accordingly, the electronic package device M1 can be mounted on a printed circuit board, and can cooperate with other electronic components disposed on the printed circuit board.

Figure 9:
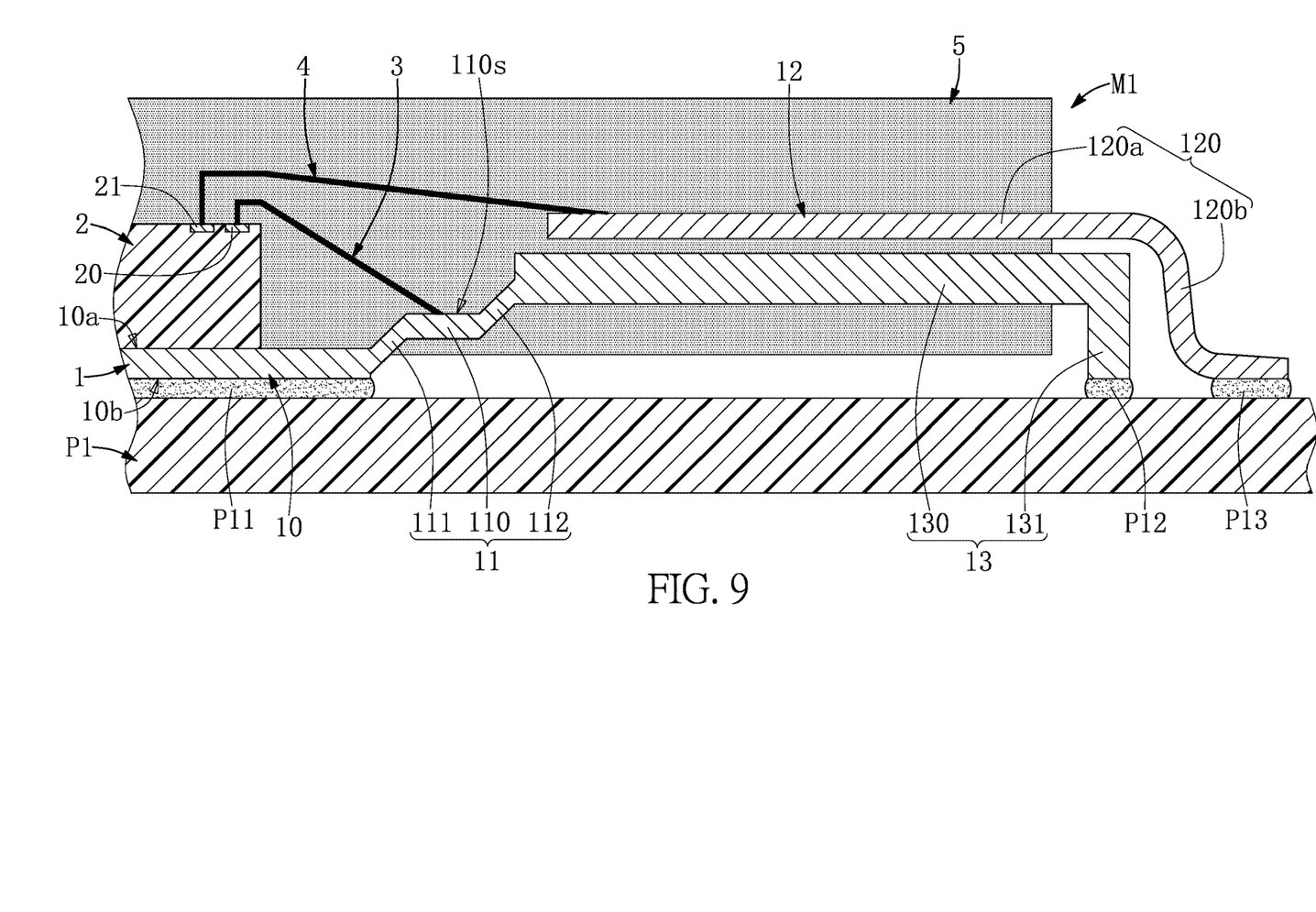
FIG. 9 is a partial cross-sectional view of the electronic package device shown in FIG. 6 that is assembled to a printed circuit board.

Referring to FIG. 9, FIG. 9 is a partial cross-sectional schematic view of the electronic package device shown in FIG. 6 that is assembled to a printed circuit board. It should be noted that a printed circuit board P1 includes a plurality of traces (not illustrated in FIG. 9), so that the electronic package device M1 can be electrically connected to other electronic components (not shown in FIG. 9). The aforementioned electronic components may include, for example, a memory, a passive component, and a discrete component, but the present disclosure is not limited thereto. The memory can be a dynamic random access memory (DRAM) or a flash memory, etc. The passive component may be a resistor, a capacitor, or an inductor, and the discrete component is, for example, a transistor or a diode, but the present disclosure is not limited thereto.

That is to say, when the electronic package device M1 is mounted on the printed circuit board P1, the electronic package device M1 and the electronic component (not shown in the figures) can be electrically connected to each other through the printed circuit board P1 so as to transmit signals therebetween. In one embodiment, the signals can be transmitted among the electronic package device M1 and the electronic components at a higher signal transmission speed (for example, higher than 1800 MHz).

The printed circuit board P1 further includes a first ground pad P11, at least one second ground pad P12 and at least one signal/power pad P13 that are disposed at an assembly side thereof. As shown in FIG. 9, when the electronic package device M1 is mounted on the printed circuit board P1, the bottom surface 10b of the die attach paddle 10 is in alignment with the first ground pad P11, and the joint part 131 of the ground wing portion 13 is in alignment with the second ground pad P12. Moreover, the bent portion 120b of each of the pins 120 is in alignment with a corresponding one of the signal/power pads P13.

As shown in FIG. 9, during the operation of the electronic package device M1, a loop area of a current path that is formed by one of the second conductive wires 4, one of the pins 120, the ground wing portion 13, the ground frame 11 and one of the first conductive wires 3 can be decreased. By decreasing the loop area, the parasitic inductance can be reduced, thereby further decreasing power noise and factors that result in signal impedance mismatch and improving the power integrity. That is to say, compared to the conventional lead frame, the ground wing portion 13 of each of the carrier structures 1, 1a, 1b in the embodiments of the present disclosure can provide a ground path that is closer to the pins 120, so as to decrease the loop area.

Figure 10:
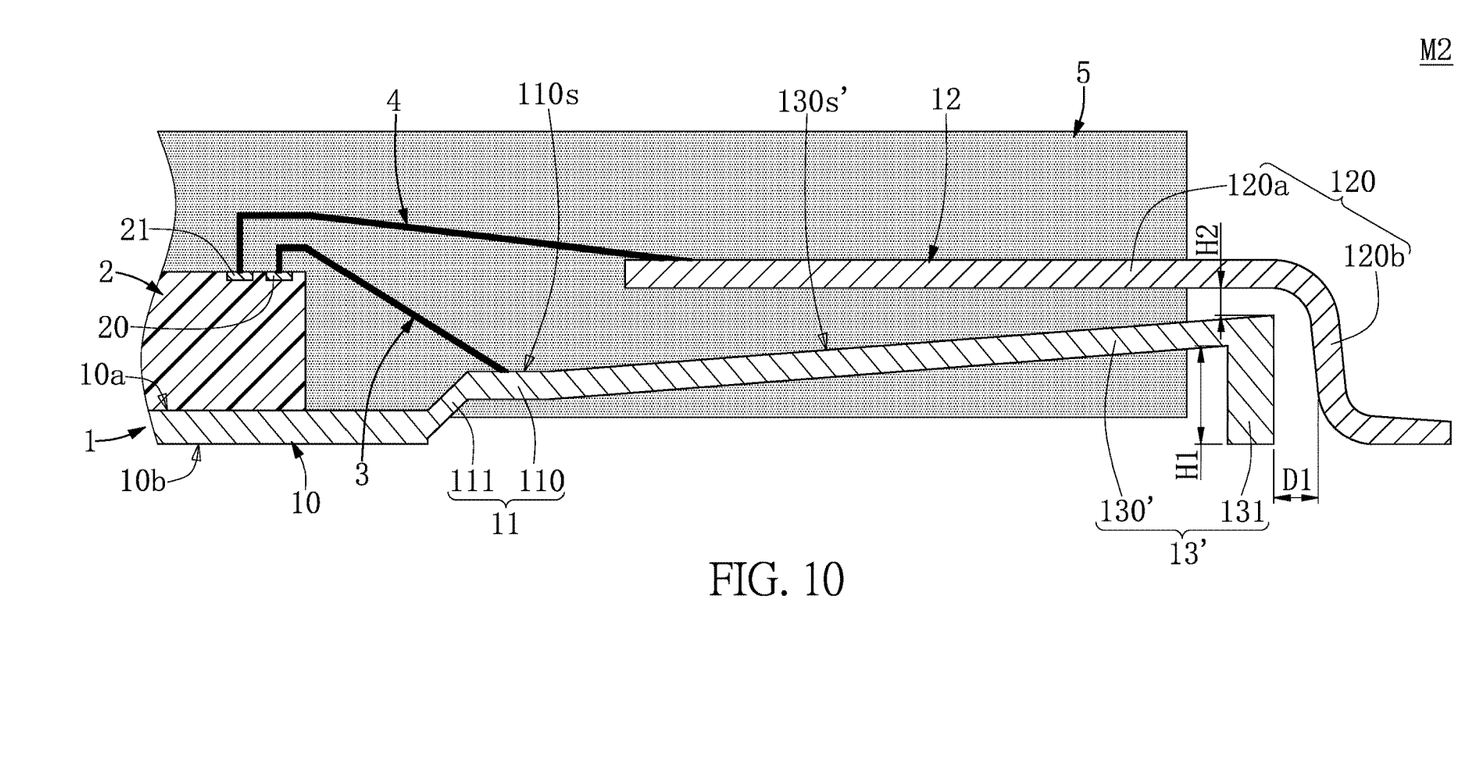
FIG. 10 is a partial cross-sectional view of an electronic package device according to another embodiment of the present disclosure.

As mentioned previously, the shape of the ground wing portion 13 is not limited to the embodiment shown in FIG. 9. Reference is made to FIG. 10, which is a partial cross-sectional schematic view of an electronic package device according to another embodiment of the present disclosure. Elements of an electronic package device M2 in the instant embodiment which are similar to or the same as those of the electronic package device M1 shown in FIG. 8 are denoted by the same reference numerals, and will not be reiterated herein.

A difference between the instant embodiment and the embodiment shown in FIG. 8 is that the ground frame 11 of the instant embodiment does not include the second connection element 112, and an extending part 130' of the ground wing portion 13 extends directly from the frame body 110 toward the main portions 120a of the pins 120 and has an inclined surface 130's.

In the instant embodiment, the top end of the extending part 130' is located at a position higher than a position of the bottom surface 10b of the die attach paddle 10, so that the loop area can be decreased, thereby reducing the parasitic inductance. In one embodiment, a largest height difference H1 between the extending part 130' and the bottom surface 10b of the die attach paddle 10 is greater than a shortest vertical distance H2 between the extending part 130' and one of the pins 120.

Furthermore, the shortest vertical distance H2 between the extending part 130' and one of the pins 120 is less than the pitch d1 between two adjacent ones of the pins 120. As such, the ground wing portion 13 of the instant embodiment can shield the pins 120 and reduce the crosstalk between the signals transmitted by two adjacent ones of the pins 120. To be more specific, a largest horizontal distance D1 between the joint part 131 and the bent portion 120b of the pin 120 that is disposed over the ground wing portion 13 is less than the pitch d1 between two adjacent ones of the pins 120, but the present disclosure is not limited thereto.

Figure 11:
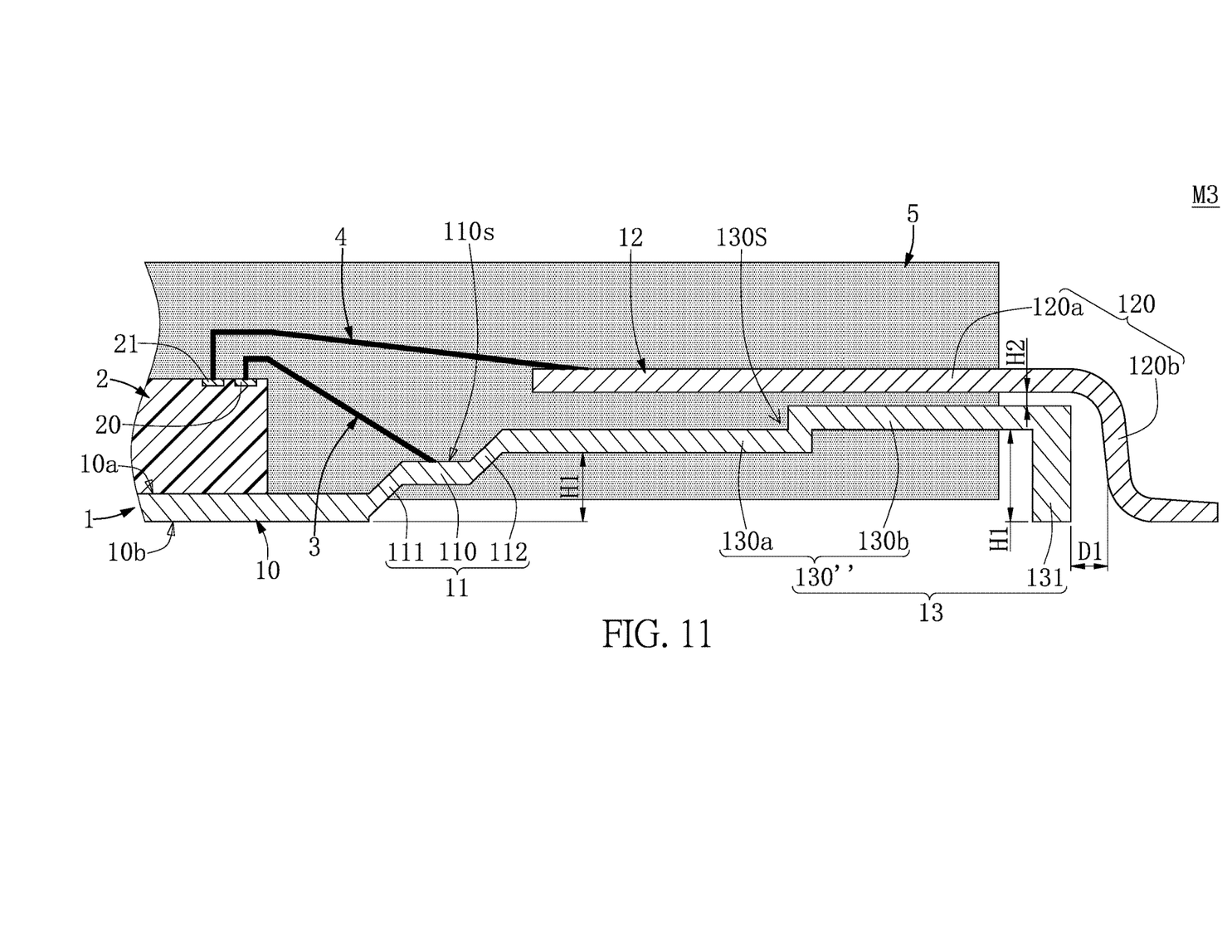
FIG. 11 is a partial cross-sectional view of an electronic package device according to yet another embodiment of the present disclosure.

Reference is made to FIG. 11, which is a partial cross-sectional schematic view of an electronic package device according to yet another embodiment of the present disclosure. Elements of an electronic package device M3 in the instant embodiment which are similar to or the same as those of the electronic package device M1 shown in FIG. 8 are denoted by the same reference numerals, and will not be reiterated herein.

A difference between the instant embodiment and the embodiment shown in FIG. 8 is that an extending part 130" of the ground wing portion 13 includes a stepped structure 130S. Accordingly, a top surface of the extending part 130" is a non-planer surface. Specifically, the extending part 130" includes a lower platform 130a farther away from the pins 120 and an upper platform 130b closer to the pins 120, and there is a height difference between a top surface of the upper platform 130b and a top surface of the lower platform 130a, so as to form the stepped structure 130S. In the instant embodiment, the lower platform 130a is connected to the second connection element 112 of the ground frame 11, and the upper platform 130b is connected to the joint part 131, but the present disclosure is not limited thereto. In another embodiment, the upper platform 130b can be connected to the second connection element 112 of the ground frame 11, and the lower platform 130b is connected to the joint part 131.

In the instant embodiment, as long as the top end of the extending part 130" is located at a higher position than the position of the bottom surface 10b of the die attach paddle 10, the loop area can be decreased, thereby reducing the parasitic inductance. In an exemplary embodiment, the largest height difference H1 between the extending part 130" and the bottom surface 10b of the die attach paddle 10 is greater than the shortest vertical distance H2 between the extending part 130" and one of the pins 120.

Similar to the previous embodiment, the shortest vertical distance H2 between the extending part 130" and one of the pins 120 is less than the pitch d1 between two adjacent ones of the pins 120, so that the ground wing portion 13 shields the pins 120, thereby reducing the crosstalk between the signals transmitted by two adjacent ones of the pins 120.

According to practical simulation results, compared to the electronic package structure that includes the conventional lead frame (not including the ground wing portion), the crosstalk among signals transmitted by the pins 120 can be significantly reduced during the operation of the electronic package devices M1-M3 of the embodiments of the present disclosure (the carrier structure 1 including the ground wing portion 13). Additionally, variations of the ground bounce and the power bounce are evidently decreased. That is to say, by using the carrier structures 1, 1a, and 1b of the embodiments of the present disclosure, the power and ground noises can be reduced, so as to improve the power integrity. As such, the electronic package devices M1-M3 each have better performance during signal transmission at a higher speed.

Beneficial Effects of the Embodiments

In conclusion, one of the advantages of the electronic package devices M1-M3 and the carrier structures 1, 1a, 1b thereof provided by the present disclosure is that, through technical features of "the ground wing portion 13 being connected to the ground frame 11 and located under the pin assembly 12, in which the ground wing portion 13 includes the extending part 130, 130' or 130" and the joint part 131," and "a top end of the extending part 130, 130' or 130" is located at a position above where a bottom surface of the die attach paddle is located," the loop area defined by the current path can be decreased. As such, the impedance, the power noise, and the ground noise of signal transmission paths can be reduced, thereby improving the power integrity.

On the other hand, by either the shortest vertical distance H2 between the extending part 130, 130' or 130" of the ground wing portion 13 and the main portion 120a of one of the pins 120, or the largest horizontal distance D1 between the joint part 131 of the ground wing portion 130 and the bent portion 120b of one of the pins 120 being less than the pitch d1 between two adjacent ones of the pins 120, the pins 120 can be more effectively shielded by the ground wing portion 13. As such, even without having additional ground pins arranged among the pins 120, the signal interference can still be reduced, and the signal transmission quality can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A carrier structure, comprising:
   a die attach paddle;
   a ground frame surrounding the die attach paddle;
   a pin assembly including a plurality of pins that are spaced apart from one another, wherein the pins extend radially outward and are arranged to surround the ground frame; and
   a ground wing portion connected to the ground frame and located in a space under the pin assembly, wherein the ground wing portion includes an extending part and a joint part, the extending part extends away from the die attach paddle, and a top end of the extending part is located at a position above where a bottom surface of the die attach paddle is located.

2. The carrier structure according to claim 1, wherein a portion of the plurality of pins is disposed above and across the ground wing portion, and another portion of the plurality of pins does not overlap with the ground wing portion in a vertical direction.

3. The carrier structure according to claim 1, wherein each of the pins includes a main portion and a bent portion connected to the main portion, and a shortest vertical distance between the main portion of one of the pins disposed above and across the ground wing portion and the extending part of the ground wing portion is less than a pitch between two adjacent ones of the pins.

4. The carrier structure according to claim 1, wherein each of the pins includes a main portion and a bent portion connected to the main portion, and a largest horizontal distance between the bent portion of one of the pins disposed above and across the ground wing portion and the joint part of the ground wing portion is less than a pitch between two adjacent ones of the pins.

5. The carrier structure according to claim 1, further comprising another ground wing portion, the ground wing portion and the another ground wing portion being respectively located at two different sides of the ground frame.

6. The carrier structure according to claim 1, further comprising another ground wing portion, the ground wing portion and the another ground wing portion being located at a same side of the ground frame and spaced apart from each other.

7. The carrier structure according to claim 1, wherein the ground wing portion extends outwardly from the ground frame and completely surrounds the ground frame.

8. The carrier structure according to claim 1, wherein the ground frame includes a frame body, at least one first connection element, and at least one second connection element, the at least one first connection element extends downward from the frame body to the die attach paddle, and the at least one second connection element extends upward from the frame body to the ground wing portion.

9. The carrier structure according to claim 1, wherein a largest height difference between the extending part and the bottom surface of the die attach paddle is greater than a shortest vertical distance between the extending part and one of the pins.

10. An electronic package device, comprising:
    a carrier structure including:
      a die attach paddle;
      a ground frame surrounding the die attach paddle;
      a pin assembly including a plurality of pins that are spaced apart from one another, wherein the pins extend radially outward and are arranged to surround the ground frame; and
      a ground wing portion connected to the ground frame and located in a space under the pin assembly, wherein the ground wing portion includes an extending part and a joint part, the extending part extends away from the die attach paddle, and a top end of the extending part is located at a position above where a bottom surface of the die attach paddle is located;
    a chip disposed on the die attach paddle of the carrier structure;
    a plurality of first conductive wires connected to the chip and the ground frame;
    a plurality of second conductive wires connected to the chip and respectively connected to the pins; and
    a mold layer covering the chip, the first conductive wires, and the second conductive wires, wherein the mold layer partially covers the carrier structure, and the joint part of the ground wing portion is not covered by and exposed from the mold layer.

11. The electronic package device according to claim 10, wherein a portion of the plurality of pins is disposed above and across the ground wing portion, and another portion of the plurality of pins does not overlap with the ground wing portion in a vertical direction.

12. The electronic package device according to claim 10, wherein each of the pins includes a main portion and a bent portion connected to the main portion, and the main portion of one of the pins disposed above and across the ground wing portion and the extending part of the ground wing portion have a shortest vertical distance therebetween, and the shortest vertical distance is less than a pitch between two adjacent ones of the pins.

13. The electronic package device according to claim 10, wherein each of the pins includes a main portion and a bent portion connected to the main portion, and a largest horizontal distance between the bent portion of one of the pins disposed above and across the ground wing portion and the joint part of the ground wing portion is less than a pitch between two adjacent ones of the pins.

14. The electronic package device according to claim 10, wherein the carrier structure further includes another ground wing portion, and the ground wing portion and the another ground wing portion are respectively located at two different sides of the ground frame.

15. The electronic package device according to claim 10, wherein the carrier structure further includes another ground wing portion, and the ground wing portion and the another ground wing portion are located at a same side of the ground frame and spaced apart from each other.

16. The electronic package device according to claim 10, wherein the ground wing portion extends outwardly from the ground frame and completely surrounds the ground frame.

17. The electronic package device according to claim 10, wherein a largest height difference between the extending part and the bottom surface of the die attach paddle is greater than a shortest vertical distance between the extending part and one of the pins.

18. The electronic package device according to claim 10, wherein each of the pins includes a main portion and a bent portion connected to the main portion, and the mold layer covers the main portion of each of the pins and does not cover the bent portion.

19. The electronic package device according to claim 10, wherein the bottom surface of the die attach paddle is exposed at one of the surfaces of the mold layer.

\* \* \* \* \*